(12) United States Patent
Pickering et al.

(10) Patent No.: US 9,961,758 B1
(45) Date of Patent: May 1, 2018

(54) PACKAGING A PRINTED CIRCUIT BOARD HAVING A PLURALITY OF SEMICONDUCTORS IN AN INVERTER

(71) Applicant: Nidec Motor Corporation, St. Louis, MO (US)

(72) Inventors: William Pickering, Lyndhurst, OH (US); Bruce A. Nielsen, North Perry, OH (US)

(73) Assignee: Nidec Motor Corporation, St. Louis, MO (US)

( * ) Notice: Subject to any disclaimer, the term of this patent is extended or adjusted under 35 U.S.C. 154(b) by 0 days. days.

(21) Appl. No.: 15/289,426

(22) Filed: Oct. 10, 2016

(51) Int. Cl.
| | |
|---|---|
| *H05K 1/02* | (2006.01) |
| *H01L 23/367* | (2006.01) |
| *H01L 23/498* | (2006.01) |
| *H05K 1/18* | (2006.01) |
| *H05K 5/00* | (2006.01) |
| *H01L 25/07* | (2006.01) |
| *H05K 1/03* | (2006.01) |
| *H01M 10/42* | (2006.01) |

(52) U.S. Cl.
CPC ......... *H05K 1/0206* (2013.01); *H01L 23/367* (2013.01); *H01L 23/49827* (2013.01); *H01L 23/49844* (2013.01); *H01L 25/072* (2013.01); *H01M 10/425* (2013.01); *H05K 1/0263* (2013.01); *H05K 1/0298* (2013.01); *H05K 1/0313* (2013.01); *H05K 1/181* (2013.01); *H05K 5/0008* (2013.01); *H05K 5/0026* (2013.01); *H05K 2201/0162* (2013.01); *H05K 2201/09036* (2013.01); *H05K 2201/10037* (2013.01); *H05K 2201/10166* (2013.01); *H05K 2201/10272* (2013.01)

(58) Field of Classification Search
CPC ....... H05K 1/02; H01L 23/367; H01M 10/425
USPC ................. 361/704, 711, 714, 717
See application file for complete search history.

(56) References Cited

U.S. PATENT DOCUMENTS

| | | | |
|---|---|---|---|
| 4,626,750 A * | 12/1986 | Post ................... | B60L 11/1805 318/139 |
| 7,193,307 B2 | 3/2007 | Duggan et al. | |
| 7,450,387 B2 | 11/2008 | Cheng et al. | |
| 7,724,528 B2 | 5/2010 | Mahoney et al. | |
| 8,198,134 B2 | 6/2012 | Noquil | |
| 8,243,454 B2 * | 8/2012 | Oota ...................... | H01L 23/42 165/80.3 |
| 8,575,737 B2 | 11/2013 | Cho | |
| 9,147,630 B2 | 9/2015 | Carletti | |

(Continued)

*Primary Examiner* — Mukund G Patel
(74) *Attorney, Agent, or Firm* — Maginot Moore & Beck LLP

(57) ABSTRACT

An electrical device configuration enables heat to be dissipated from a multi-layer printed circuit board (PCB) while handling electrical currents in excess of 200 amps. The semiconductor devices that convert input DC current to output AC current are mounted to a side of the PCB that is opposite the side of the PCB that receives the input DC current. A base plate that acts as a heat sink includes recessed areas to receive the semiconductor devices and enable the PCB to be positioned close to the base plate. Thermal vias are provided in the PCB to conductive heat from the semiconductor devices to the side of the PCB that receives the input current. Also, the busbars for receiving the input current are positioned to provide short resistive paths to the current to reduce the generation of heat by the current flowing in the PCB.

15 Claims, 7 Drawing Sheets

(56) References Cited

U.S. PATENT DOCUMENTS

| | | |
|---|---|---|
| 9,281,260 B2 | 3/2016 | Standing et al. |
| 9,385,631 B2 * | 7/2016 | Kontani ............... H05K 1/0263 |
| 9,431,317 B2 | 8/2016 | Chen et al. |
| 2002/0054480 A1 * | 5/2002 | Jitaru ..................... H01F 27/06 |
| | | 361/704 |
| 2009/0027859 A1 | 1/2009 | Giacoma |

* cited by examiner

PACKAGING A PRINTED CIRCUIT BOARD HAVING A PLURALITY OF SEMICONDUCTORS IN AN INVERTER

TECHNICAL FIELD

This disclosure is directed to the packaging of printed circuit cards to which a plurality of semiconductors has been mounted in an electronic device and, more particularly, to the packaging of such printed circuit cards in electronic devices that control large electrical currents.

BACKGROUND

Most electronic devices typically include a printed circuit board (PCB) to which a number of semiconductor components are mounted to perform a task in an application. In some applications, the electronic devices handle significant amounts of current that can produce enough heat within the device that the components or the PCB can be damaged unless the heat is dissipated. One such application arises from the use of inverters in electrical vehicles to control the conversion of DC battery power to three phase AC power for delivery to an electrical motor in the vehicle. The conversion of the DC current to AC current typically requires the use of metal oxide semiconductor field effect transistors (MOSFETs) mounted to the PCB. Sub-groups of the MOSFETs are driven by a controller to produce each of the phases in the AC current. The switching of these transistors to regulate the flow of the current through the transistors produces significant amounts of heat that need to be dissipated.

One solution to the problem of dissipating heat from semiconductors mounted to a PCB has been to use an insulated metal substrate (IMS). An IMS is composed of a metal sheet, such as aluminum, that is covered by a dielectric layer over which a circuit layer is laid. The metal substrate is usually mounted to a heat sink so the heat absorbed by the substrate from the circuit layer is removed from the metal substrate. The heat is conducted to the metal substrate through thermal vias formed as thermal conductive paths, such as copper, from an area of the circuit layer through the dielectric layer to the metal substrate. One drawback to this type of PCB is the outgassing of the solder paste that occurs when the semiconductor components are mounted to the PCB. This outgassing can form air pockets in the solder around the leads of the current conducting semiconductors and the air pockets degrade the ability of the semiconductors, such as MOSFETs, to conduct electrical current properly.

Another solution uses multi-layer PCBs. The multi-layer construction enabled some semiconductors to be mounted to one side of the PCB and other semiconductors to be mounted to the other side. This configuration is useful in some applications, but in applications where the current passing through the semiconductors can exceed 200 amps the thermal conductivity of the multi-layer PCB was deemed ineffective and device breakdown was more likely. Thus, finding a way of configuring a PCB and its semiconductor components in high current applications that produce significant amounts of heat without degrading the quality of the soldering of the components to the PCB would be beneficial.

SUMMARY

A new configuration of a PCB with semiconductor components that handle high levels of electrical current enables multi-layer PCBs to be used beyond current levels previously considered beyond the ability of such PCBs. The electrical device includes a metal base plate having at least one recessed area in a floor of the base plate, a multi-layer printed circuit board (PCB) having a first surface and a second surface, the first surface being opposite to the second surface, at least two busbars mounted to the first surface of the PCB, a first busbar being configured for connection to one terminal of a battery and a second busbar being configured for connection to another terminal of the battery, a plurality of semiconductor devices mounted to the second surface of the PCB, a first group of the semiconductor devices being electrically connected to the first busbar and a second group of semiconductor devices being electrically connected to the second busbar, the plurality of semiconductor devices being positioned on the second side of the PCB to enable the at least one recessed area in the floor of the base plate to receive the semiconductor devices when the PCB is positioned within a periphery of the base plate.

BRIEF DESCRIPTION OF THE DRAWINGS

The foregoing aspects and other features of PCB configurations having semiconductors that handle high levels of electrical current are provided in the following description, taken in connection with the accompanying drawings.

DETAILED DESCRIPTION

Figure 1:
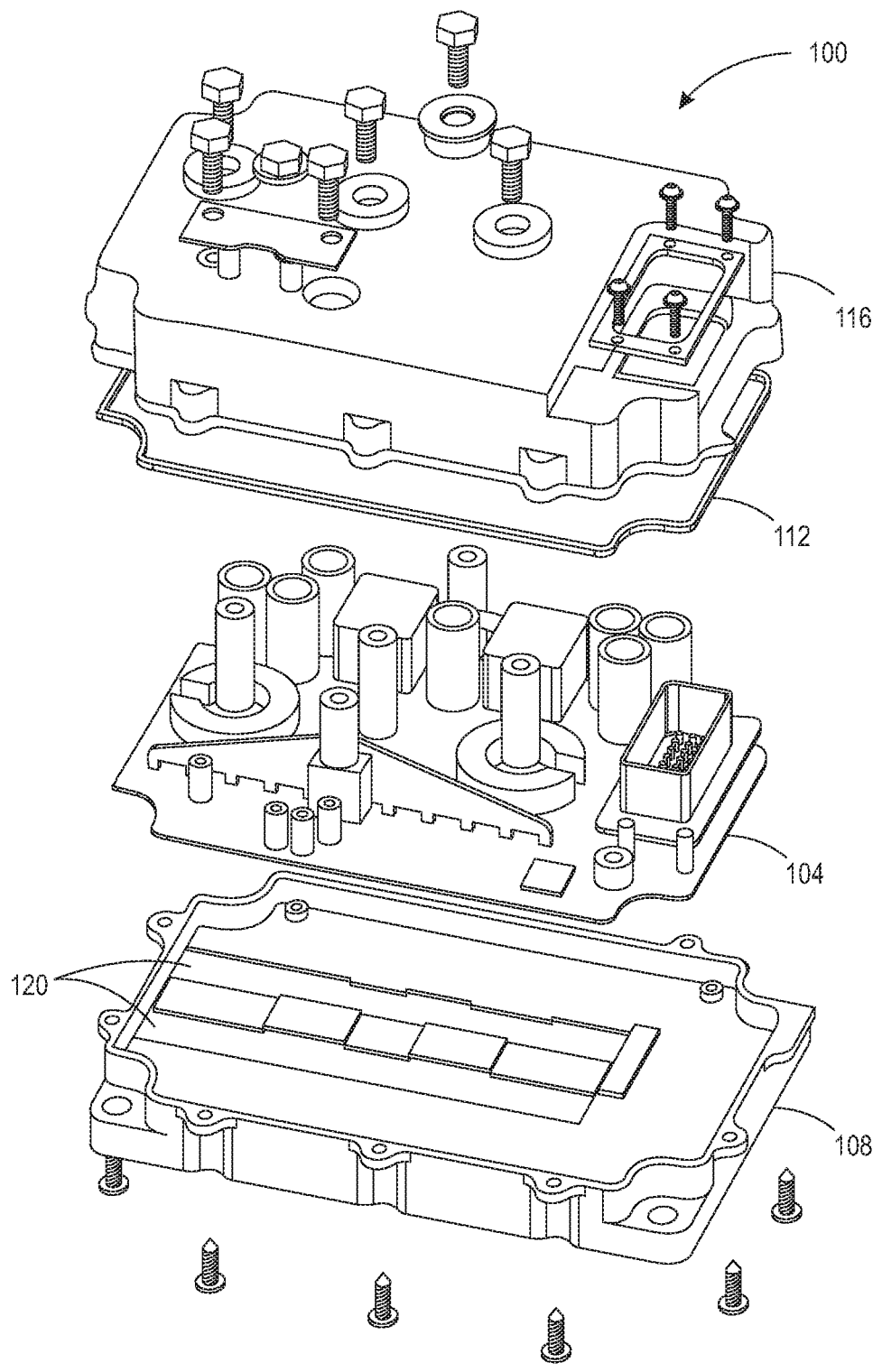
FIG. 1 depicts an exploded view of an electrical inverter having a multi-layer PCB with MOSFETs mounted to it that enable the MOSFETs to handle high levels of electrical current reliably with adequate thermal dissipation.

For a general understanding of the environment for the device disclosed herein as well as the details for the device, reference is made to the drawings. In the drawings, like reference numerals designate like elements.

Figure 2:
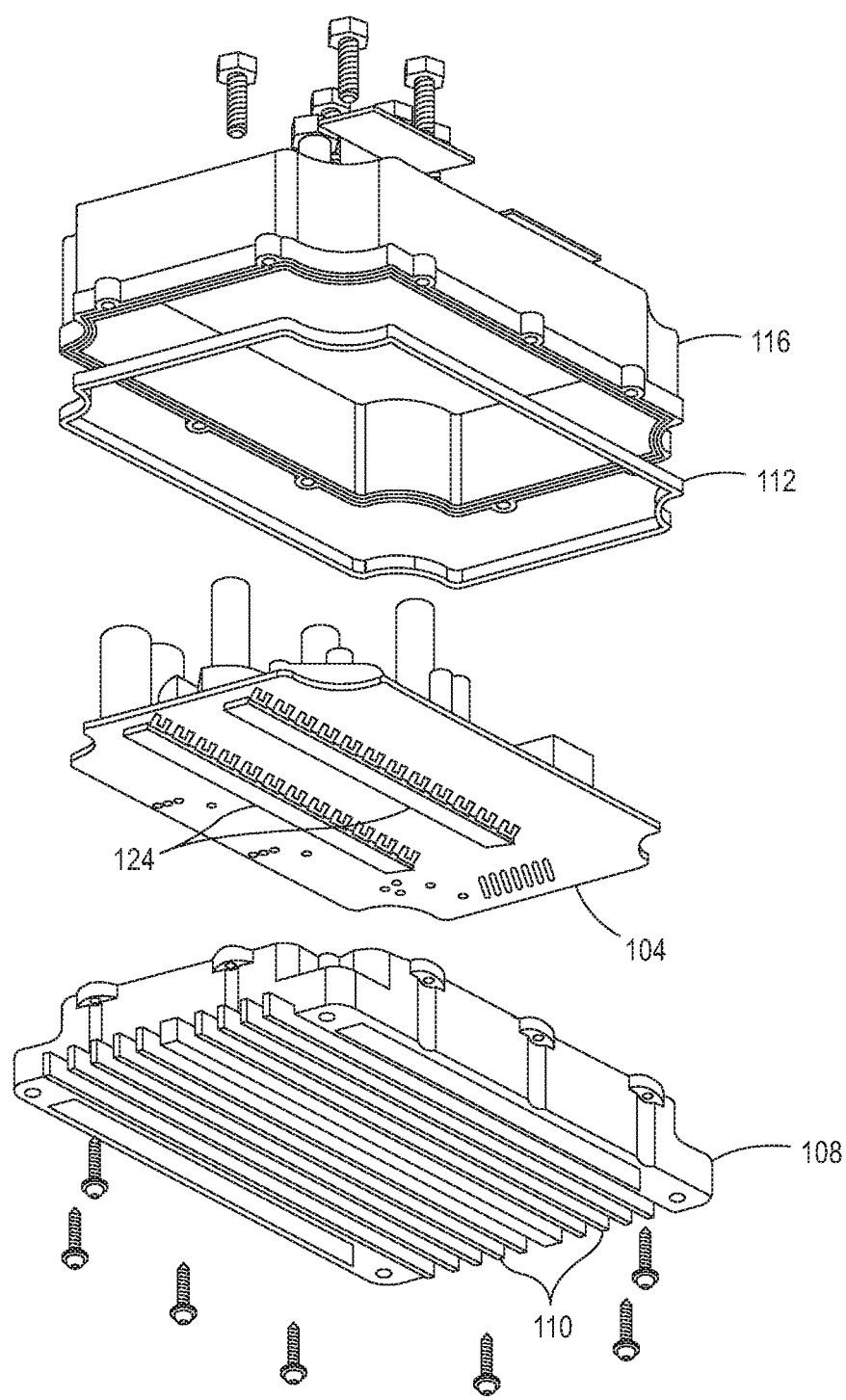
FIG. 2 is the exploded view of the inverter shown in FIG. 1 from a perspective that views the underside of the inverter.

FIG. 1 is an exploded view of an inverter 100 that configures the multi-layer PCB and its components within a housing having a base plate to enable the semiconductor components to handle high levels of electrical current with adequate thermal compensation. The inverter 100 includes a multi-layer PCB 104, a base plate 108, a seal 112, and a housing 116. The multi-layer PCB 104 is made of a substrate formed from epoxy-fiberglass, flame retardant 4 (FR4) material, or other like material having copper cladding on its opposing surfaces. The surface of the PCB 104 is populated with components, such as capacitors, resistors, transistors, and logic circuits. The base plate 108 is formed from aluminum and configured with a periphery that corresponds to the periphery of the PCB 104. Within the interior of the base plate 108 are recessed areas 120 that accommodate MOSFETs 124 mounted to the underside of the PCB 104 as shown in FIG. 2. These recessed areas enable the surfaces of the MOSFETs 124 not adjacent to the PCB 104 to be positioned very close to the floor of the recessed areas 120.

In one embodiment, the surfaces of the MOSFETs and the floor of the recessed areas 120 are separated by 0.020 inches. Thus, the PCB 104 mounts against the base plate 108 along its periphery and the surface of the PCB to which the MOSFETs are mounted is close to the base plate 108. This fitting of the MOSFETs within the recessed areas 120 enables the capacitors mounted to the upper surface of the PCB 104 to be taller than if the recessed areas were not provided. The taller capacitors are larger so fewer capacitors are required for a circuit design. The seal 112 is made of a flexible, resilient material, such as rubber, to form a barrier against ambient air and the particles and moisture in the ambient air when the housing 116 is mounted to the base plate 108. The seal 112 also corresponds to the periphery of the PCB 104. The housing 116 is manufactured as a plastic molded part, although other materials and methods can be used to form the housing 116.

To assembly the inverter 100, the PCB 104 and the components mounted to it are positioned against the periphery on the base plate 108 that corresponds to the periphery of the PCB 104 so the MOSFETs mounted to the underside of the PCB 104 can be received in the recessed areas 120 of the base plate. A thermal conductive compound, such as a silicone thermal compound, is pumped into the air gap between the underside of the PCB 104 and the base plate 108. This compound helps conduct heat generated by the MOSFETs into the base plate 108. As shown in FIG. 2, the base plate 108 is formed with fins 110 to facilitate the dissipation of heat from the base plate 108. Epoxy and thermal compounds are applied to the upper surface of the PCB 104 to help remove heat from the PCB. These compounds have a thermal conductivity in a range of about 0.5 W/m/° K to about 1.6 W/m/° K, although compounds with a higher thermal conductivity can also be used. Silicone compounds have an advantage that they are easier to peel away from the surface to which they have been applied for troubleshooting and they also resist moisture. The seal 112 is placed in a groove formed in the housing 116 and the housing is mounted to the base plate 108 with threaded fasteners that mate the housing to the base plate at regions outside of the periphery of the PCB 104.

FIG. 2 is the exploded view of the inverter 100 shown in FIG. 1 from a perspective that enables the underside of the PCB 104 and the underside of the base plate 108 to be observed. As can be seen in the figure, two rows of MOSFETs 124 are mounted to the underside of the PCB 104. Also visible in FIG. 2 are the fins 110 in the base plate 108 that dissipate heat absorbed by the base plate.

Figure 3:
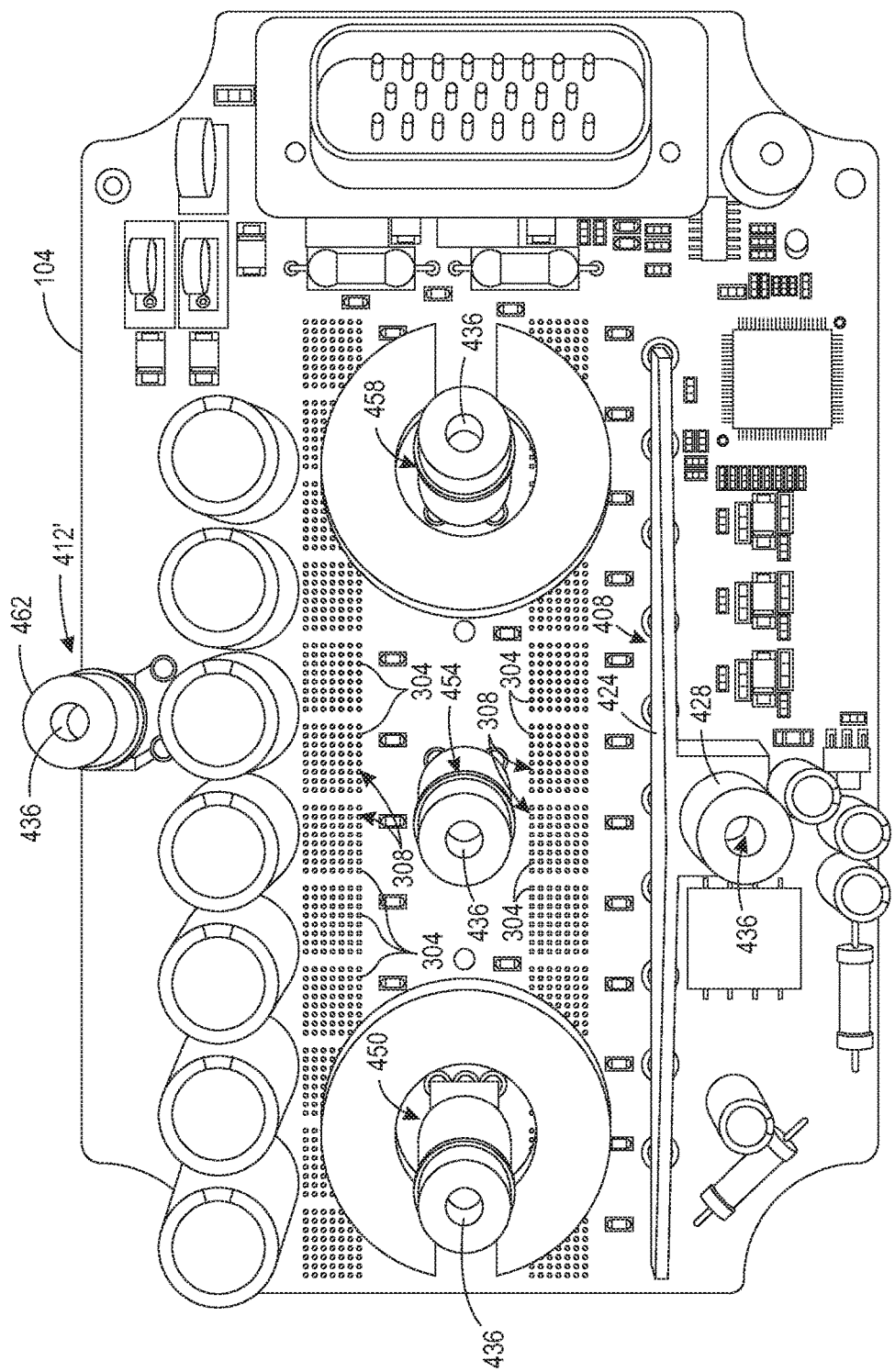
FIG. 3 is a view of the top surface of the PCB shown in FIG. 1 and FIG. 2.

FIG. 3 is a view of the PCB 104 from above the PCB. In the PCB 104 are thermal vias 304 that conduct heat from the MOSFETs mounted to the underside of the PCB 104 to the upper side of the PCB. The thermal vias are holes in the PCB that contain thermal conductive compound. Each rectangular array 308 of thermal vias 304 is positioned on the upper surface of the PCB 104 at a location that is opposite one of the MOSFETs mounted to the underside of the PCB 104. This positioning enables the thermal vias 304 to conduct heat radiating from the sides of the MOSFETs that are adjacent the underside of the PCB 104. As the heat passes through the thermal vias 304, the copper layers in the PCB 104 spread the absorbed heat through the PCB 104. In one embodiment, the layers of the PCB 104 contain at least 3 oz. of copper in its layers. The epoxies and thermal compounds applied to the upper surface of the PCB 104 as noted above help dissipate the heat absorbed by the PCB 104 into the air within the housing 116.

Figure 4:
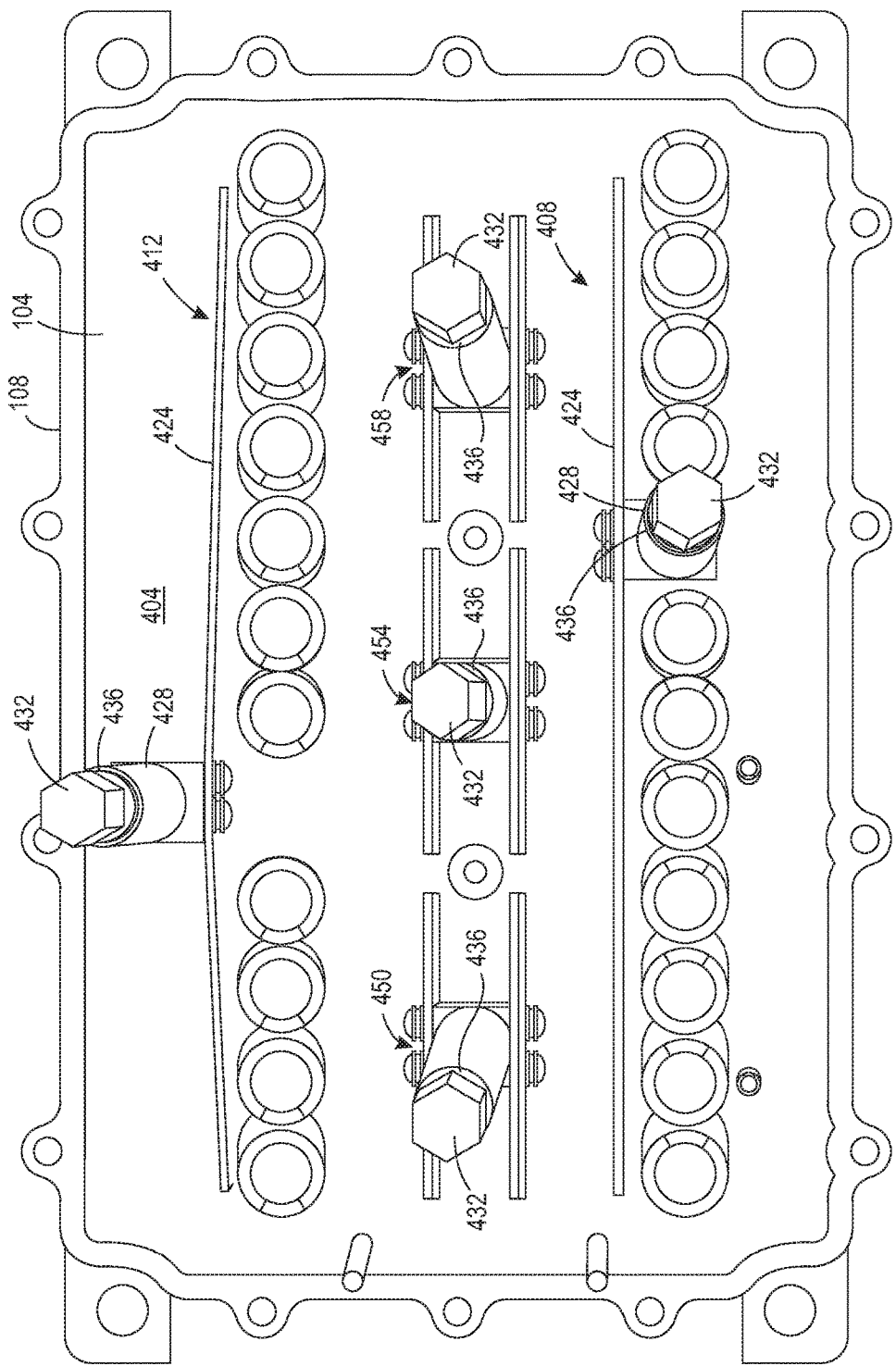
FIG. 4 is a view of the top surface of the PCB in FIG. 2 that has been treated with thermal compound and depicts two busbars on opposite sides of the surface of the PCB.
Figure 5:
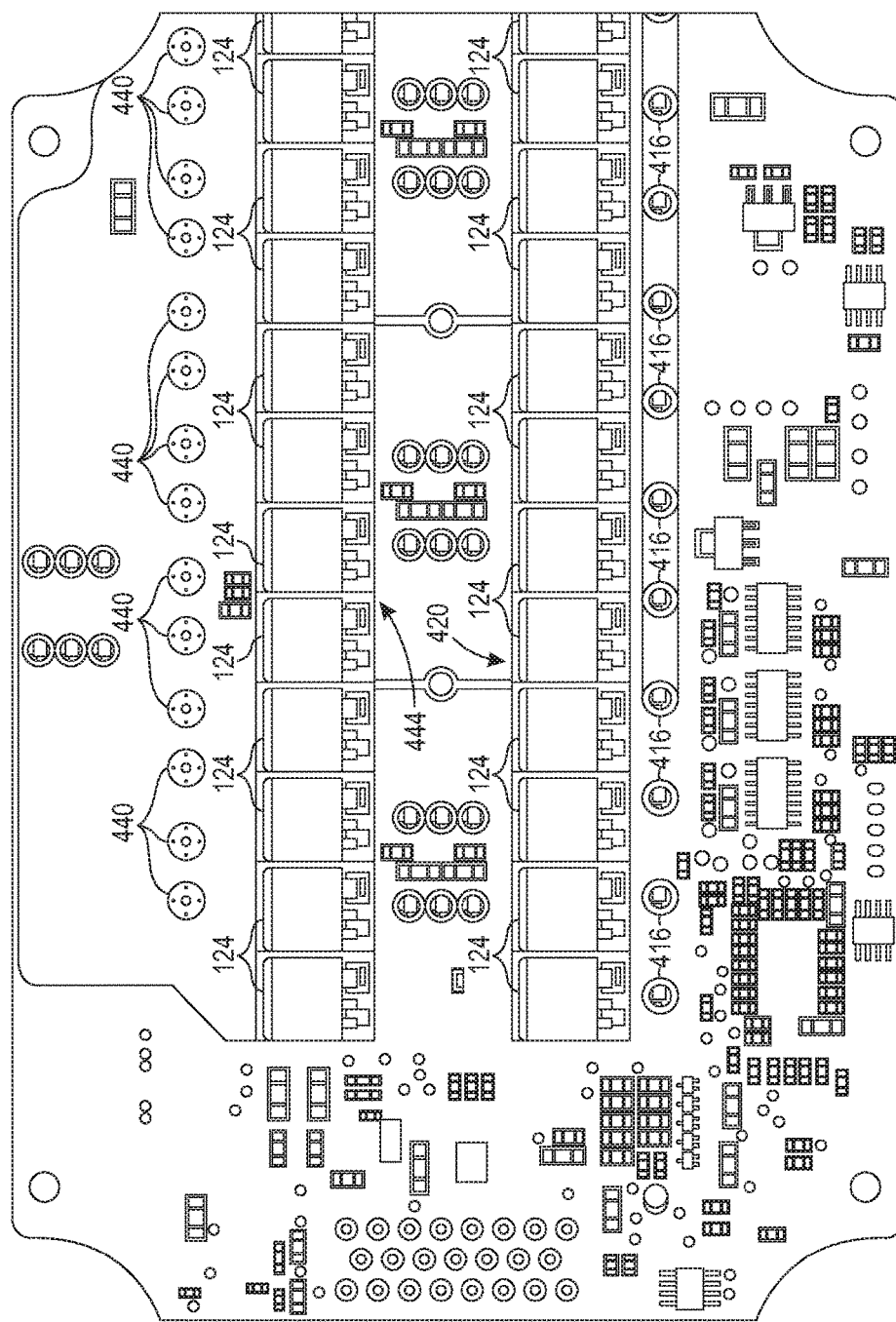
FIG. 5 is a view of the underside of the PCB shown in FIG. 1 and FIG. 2.
Figure 6:
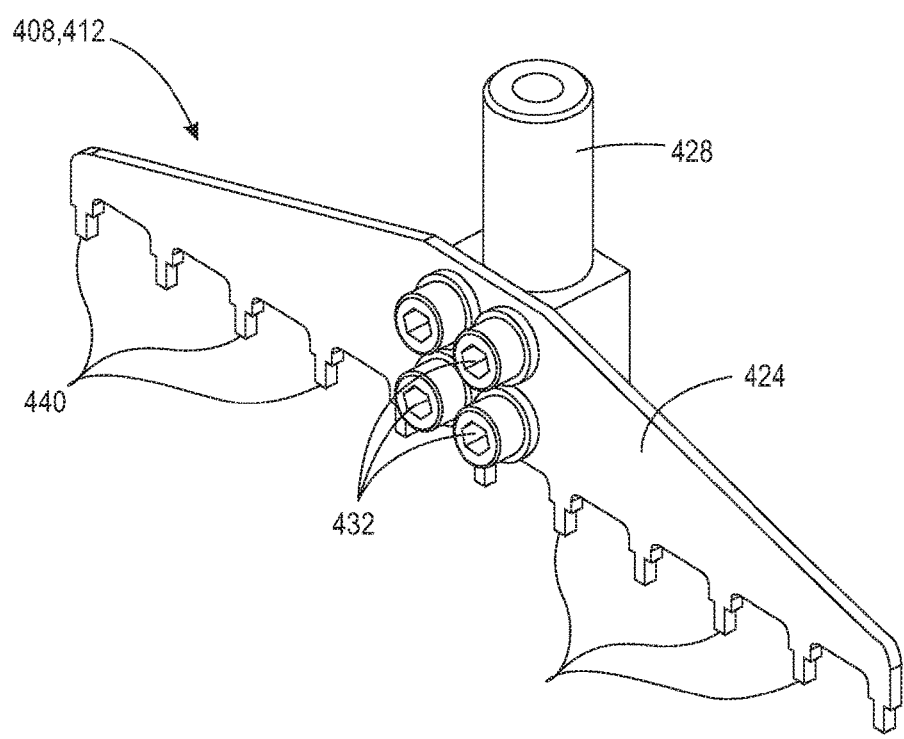
FIG. 6 is a perspective view of the busbars shown in FIG. 4.

To further enhance the thermal attenuating features of the inverter 100, the bus bars that connect the PCB 104 to the positive and negative terminals of the supply battery are configured as shown in FIG. 4. In that figure, PCB 104 is positioned within the base plate 108 and has been covered in either epoxy, silicone thermal compound, or a mixture of both 404 to help draw heat from the PCB into the air above the PCB. A busbar 408 is also mounted to the PCB 104 and is electrically connected to conductive pads 416 that are proximate to each MOSFET 124 in the row of MOSFETs 420 shown in FIG. 5. The busbar 408 has a triangular planar flange 424 that is connected to a cylindrical connector 428 as shown in FIG. 4 and FIG. 6. A threaded fastener 432 is screwed into a threaded channel 436 to enable a terminal lug from one of the battery terminals to be connected to the connector 428. This configuration enables current from one terminal of the battery to flow to the connector and be delivered to the MOSFETs in row 420 through the conductive pads 416 for the generation of AC output phases. In a similar manner, busbar 412 is also mounted to the PCB 104 and is electrically connected to conductive pads 440 that are proximate to each MOSFET 124 in the row of MOSFETs 444 shown in FIG. 5. The busbar 412 has a triangular planar flange 424 that is connected by threaded fasteners 432 to a cylindrical connector 428 as shown in FIG. 6. The busbars 408 and 412 have leads 440 that are soldered into conductive pads in the PCB 104 to enable electrical current to flow from the connector 428 to the MOSFETs electrically connected to the conductive pads to which the busbar leads have been soldered (FIG. 4). A threaded fastener 432 screwed into threaded channel 436 connects the other terminal of the battery to the connector 428 of busbar 412. This configuration enables current from the other terminal of the battery to flow to the connector and be delivered to the MOSFETs in row 444 through the conductive pads 440 for the generation of AC output phases. The output phases of the AC current that power the electrical motor are delivered through the connectors 450, 454, and 458 through cables extending from the motor to lugs connected by threaded fasteners 432 screwed into threaded channels 436 of these connectors.

This configuration helps attenuate heat in the PCB 104 because the battery current path to the respective rows of MOSFETs has been shortened from previously known paths and the output paths from each row of MOSFETs is approximately the same distance to the output terminals. In previously known configurations, the input busbars were placed on a same side of the PCB. Consequently, the path from one of the busbars to its corresponding row of MOSFETs was longer than the path from the other busbar to its corresponding row. The longer path generated more heat from the resistive heat losses produced by current flowing through the resistance of the path.

Figure 7:
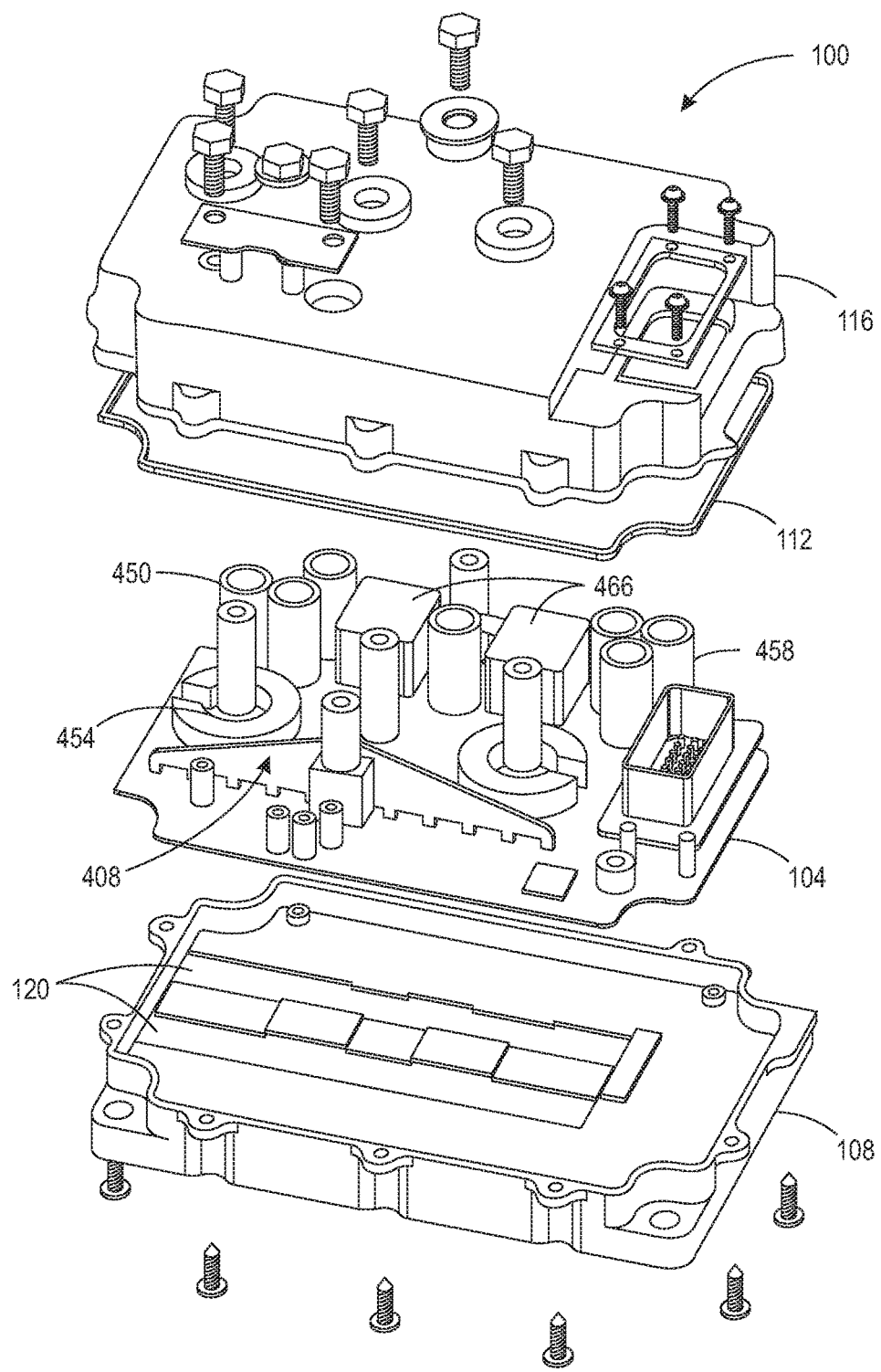
FIG. 7 depicts an alternative embodiment of the busbar configuration shown in FIG. 3 and FIG. 4.

FIG. 3 shows an alternative embodiment of the busbar configuration of FIG. 4 and FIG. 6. In this configuration, the busbar 408 is the same as the one discussed above. Busbar 412', however, is only a single cylindrical member 462 having a threaded opening 436 that receives a threaded fastener to secure a cable and lug extending from one terminal of the battery. This embodiment is less robust that the one shown in FIG. 4 and FIG. 6 in the amount of current that the busbar can handle, but it is adequate in applications in which lower battery currents are produced. Additionally, an alternative embodiment is shown in FIG. 7 in which the busbar 412' is replaced with a pair of relays 466. These relays are connected to one of the battery terminals in parallel and are operated to connect that battery terminal to the corresponding row of MOSFETs to generate the phases of the AC current supplied to the electrical motor. In all of these embodiments, the battery current from different polarities of the battery are input to the PCB 104 at positions proximate the row of MOSFETs that convert the DC current to phases of the AC current to reduce the resistive heat losses arising from a current encountering a longer resistive path to reach its corresponding row of MOSFETs.

It will be appreciated that variants of the above-disclosed and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. An electrical device comprising:
   a metal base plate having at least one recessed area in a floor of the metal base plate;
   a multi-layer printed circuit board (PCB) having a first surface and a second surface, the first surface being opposite to the second surface;
   at least two busbars mounted to the first surface of the PCB, a first busbar being configured for connection to one terminal of a battery and a second busbar being configured for connection to another terminal of the battery, at least one of the busbars having a triangular flange and a member configured with a threaded opening to receive a threaded member to secure a connector to one terminal of the battery;
   a plurality of semiconductor devices mounted to the second surface of the PCB, a first group of the semiconductor devices being electrically connected to the first busbar and a second group of semiconductor devices being electrically connected to the second busbar, the plurality of semiconductor devices being positioned on the second side of the PCB to enable the at least one recessed area in the floor of the metal base plate to receive the semiconductor devices when the PCB is positioned within a periphery of the metal base plate; and
   thermal conductive compound filling space between the second surface of the PCB and the metal base plate when the PCB is within the periphery of the metal base plate.

2. The electrical device of claim 1, wherein the at least one recessed area in the metal base plate is two recessed areas; and
   the plurality of semiconductor devices is arranged as two rows of semiconductor devices on the second surface of the PCB, each row of the semiconductor devices being positioned to be received in different recessed areas.

3. The electrical device of claim 2 wherein the semiconductor devices are metal oxide semiconductor field effect transistors.

4. The electrical device of claim 1 wherein the thermal conductive compound is silicone.

5. The electrical device of claim 1 further comprising:
   thermal conductive compound applied to the first surface of the PCB.

6. The electrical device of claim 5 wherein the thermal conductive compound is silicone.

7. The electrical device of claim 1 wherein each busbar has a triangular flange and a member configured with a threaded opening to receive a threaded member to secure a connector to one terminal of the battery.

8. An electrical device comprising:
   a metal base plate having at least one recessed area in a floor of the metal base plate;
   a multi-layer printed circuit board (PCB) having a first surface and a second surface, the first surface being opposite to the second surface;
   a busbar mounted to the first surface of the PCB, the busbar being configured for connection to one terminal of a battery, the busbar having a triangular flange and a member configured with a threaded opening to receive a threaded member to secure a connector to the other terminal of the battery;
   a pair of relays arranged in parallel for connection to another terminal of the battery;
   a plurality of semiconductor devices mounted to the second surface of the PCB, a first group of the semiconductor devices being electrically connected to the busbar and a second group of semiconductor devices being electrically connected to the pair of relays, the plurality of semiconductor devices being positioned on the second side of the PCB to enable the at least one recessed area in the floor of the metal base plate to receive the semiconductor devices when the PCB is positioned within a periphery of the metal base plate.

9. The electrical device of claim 8 further comprising:
   thermal vias in the PCB, the thermal vias being positioned to conduct heat from a side of the semiconductor devices located adjacent the second side of the PCB to the first side of the PCB.

10. The electrical device of claim 8 further comprising:
    thermal conductive compound filling space between the second surface of the PCB and the metal base plate when the PCB is within the periphery of the metal base plate.

11. The electrical device of claim 10 wherein the thermal conductive compound is silicone.

12. The electrical device of claim 11 further comprising:
    thermal conductive compound applied to the first surface of the PCB.

13. The electrical device of claim 12 wherein the thermal conductive compound is silicone.

14. The electrical device of claim 8, wherein the at least one recessed area in the metal base plate is two recessed areas; and
    the plurality of semiconductor devices is arranged as two rows of semiconductor devices on the second surface of the PCB, each row of the semiconductor devices being positioned to be received in different recessed areas.

15. The electrical device of claim 14 wherein the semiconductor devices are metal oxide semiconductor field effect transistors.

* * * * *